United States Patent [19]

Morishita et al.

[11] Patent Number: 5,046,012
[45] Date of Patent: Sep. 3, 1991

[54] PATTERN DATA PROCESSING METHOD

[75] Inventors: Kazumasa Morishita, Seto; Yoshitada Aihara, Kawasaki; Yoshihisa Komura, Tajimi; Masaaki Miyajima, Inuyama; Minoru Suzuki, Seto, all of Japan

[73] Assignees: Fujitsu Limited, Kawasaki; Fujitsu Vlsi Limited, Kasugai, both of Japan

[21] Appl. No.: 366,483

[22] Filed: Jun. 15, 1989

[30] Foreign Application Priority Data

Jun. 17, 1988 [JP] Japan ............................ 63-150851
Jul. 8, 1988 [JP] Japan ............................ 63-171418

[51] Int. Cl.⁵ ............................................. G06F 15/40
[52] U.S. Cl. ................................... 364/468; 364/491; 382/8; 382/47
[58] Field of Search .................... 364/468, 488–491; 382/8, 47; 250/492.21, 492.22, 492.23, 492.24; 357/40, 45

[56] References Cited

U.S. PATENT DOCUMENTS 4,600,995  7/1986  Kinoshita ........................ 364/491
4,864,381  9/1989  Seefeldt et al. ................. 357/45
4,942,619  7/1990  Takagi et al. ................... 382/47
4,951,216  8/1990  Maluo ............................ 364/490

Primary Examiner—Jerry Smith
Assistant Examiner—Paul Gordon
Attorney, Agent, or Firm—Staas & Halsey

[57] ABSTRACT

A pattern data processing method processes hierarchical pattern data which has a hierarchical structure and describes in each level thereof one or a plurality of internal cells constituting one or a plurality of logic blocks of a semiconductor integrated circuit device which is to be produced. The pattern processing method comprises the steps of defining a frame at a boundary between a level i of the hierarchical structure and a level i+1 which is higher than the level i, cutting a first portion of a pattern which protrudes out of the frame form the level i to the level i+1 and defining the cut, first portion as a pattern of the level i+1, cutting a second portion of a pattern which protrudes out of the frame from the level i+1 to the level i and deleting the cut, second portion, and repeating the steps of cutting the first and second portions for a predetermined number of levels for increasing values of i, where i=1, 2, . . . , n, n is an arbitrary integer and the pattern of the semiconductor integrated circuit device is described in a highest level n+1.

15 Claims, 14 Drawing Sheets

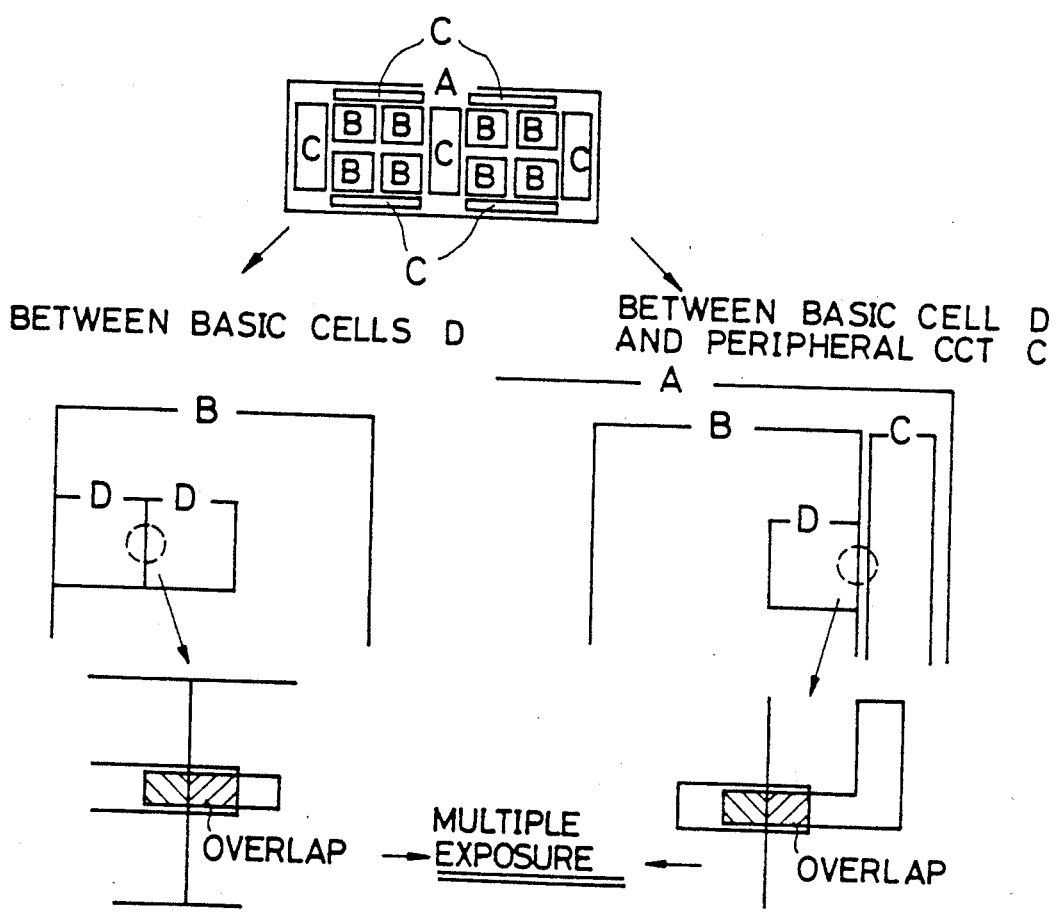

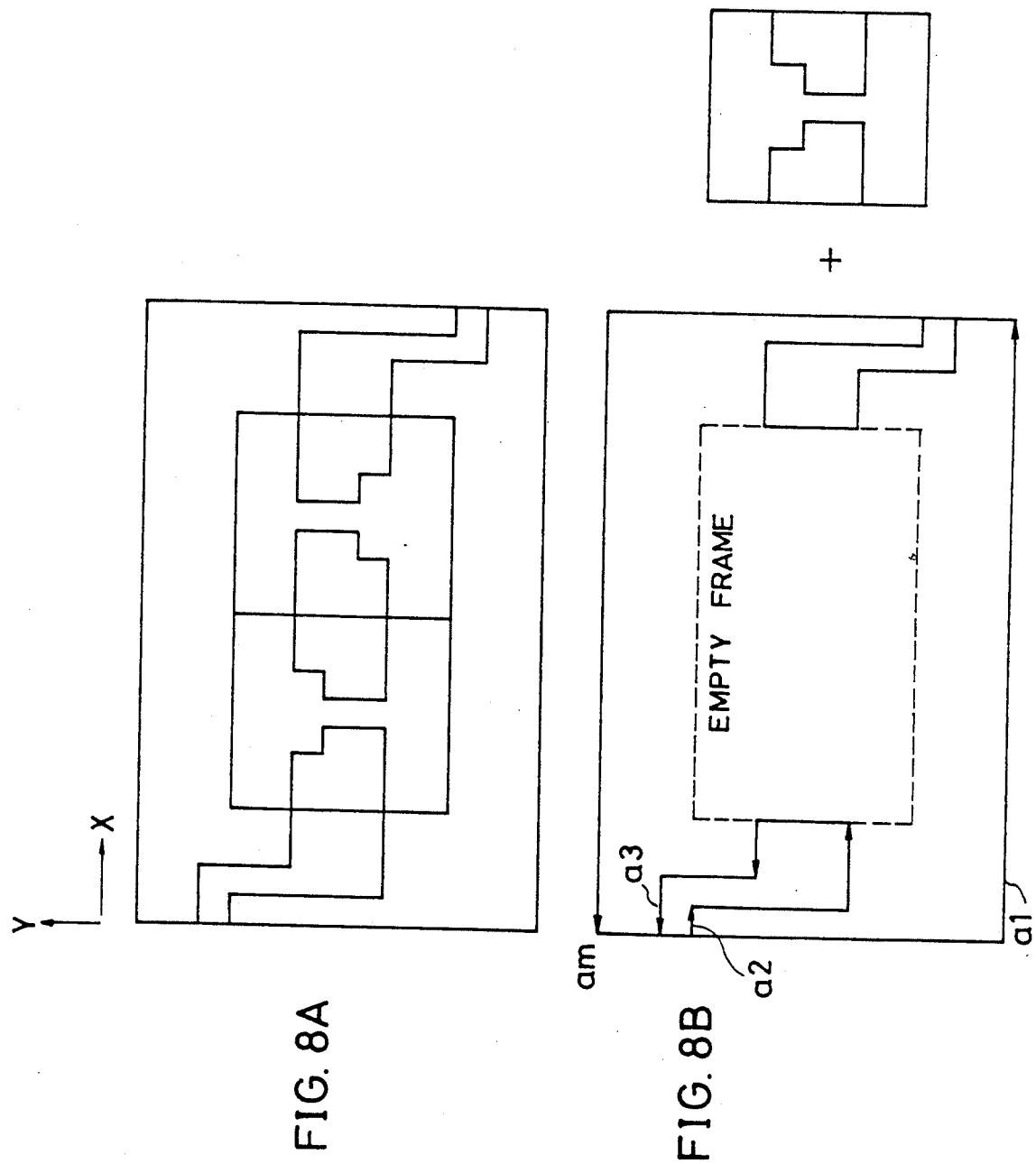

| FRAME, PATTERN RECOGNITION FLAG | DIRECTION CODE |
|---|---|
| LEFT END POINT X-COORDINATE | |
| LEFT END POINT Y-COORDINATE | |
| RIGHT END POINT X-COORDINATE | |

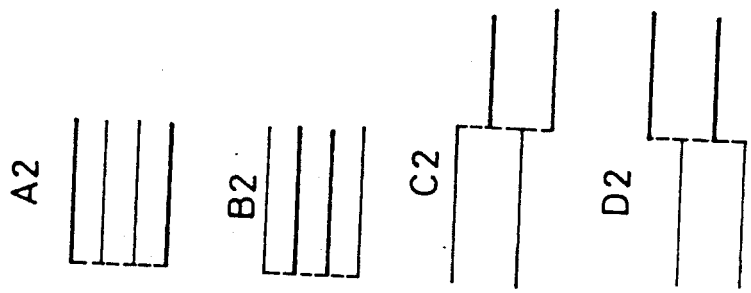
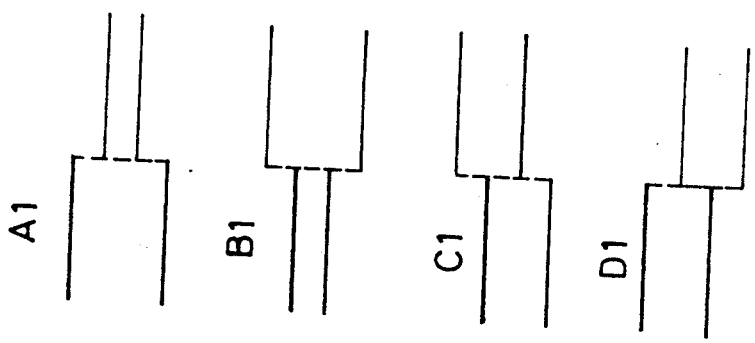
FIG.14A
FIG.14B
FIG.14C
FIG.14D

PATTERN DATA PROCESSING METHOD

BACKGROUND OF THE INVENTION

The present invention generally relates to pattern data processing methods, and more particularly to a pattern data processing method for executing a resizing process on hierarchical pattern data.

Recently, with the increase of the scale and integration density of large scale integrated circuits (LSIs), the required exposure data quantity and the processing time of the pattern processing are increasing considerably, thereby increasing the development cost of the LSIs. The conventional method of executing the pattern processing after the developing processing can no longer cope with the increased number of patterns to the processed. For example, when the conventional method is used to process the pattern data of a 4 Mbit memory, approximately 80,000,000 pattern data must be stored in 30 reels of magnetic tapes. In addition, the processing time required to process such a large data quantity on a computer is extremely long.

Especially in the case of a memory or the like, cells are often repeatedly arranged in an array. The hierarchical pattern processing can effectively utilize the data structure of such a repetition of cells by assigning the hierarchical structure to the exposure data itself and executing the pattern processing in levels of the hierarchical structure. By employing the hierarchical pattern processing, the data processing time can be greatly reduced and the data processing quantity can be compressed considerably in the case of the memory or the like having the repetition of cells. The number of patterns of the LSI after the developing process is approximately 10 to 100 times that before the developing process, and the hierarchical pattern processing is a powerful tool in realizing high-speed pattern processing when executed at a time before the developing process.

On the other hand, a resizing process is essential to the pattern data processing. When the pattern includes a notch, an oversizing to a predetermined width and an undersizing thereafter for the same predetermined width would eliminate a notch of the predetermined width. In addition, such a resizing process is executed to conform to an interface of a different exposure apparatus and when modifying a design rule.

Conventionally, the designated resizing process is executed by considering only the pattern which is the subject of the resizing process. Thus, when an overlap is generated between the patterns, a merge process is executed to eliminate the overlap. When executing an undersize resizing process, a merge process is executed before the resizing process to prevent a slit from being generated or a slit fill-in process is executed with respect to the slit after the resizing process.

FIG. 1A shows a hierarchical structure of a semiconductor integrated circuit device, and FIG. 1B is a diagram for explaining the layout pattern of the semiconductor integrated circuit device in each level of the hierarchical structure. In FIGS. 1A and 1B, A denotes the structure of an entire semiconductor integrated circuit device (chip), B denotes the structure of a memory cell having several hundred kbits, C denotes the structure of a peripheral circuit, and D denotes the structure of a basic memory cell amounting to several bits.

The data quantity at the time when actually executing the exposure is extremely large. For this reason, exposure data is conventionally made for one 128 kbit memory cell B shown in FIG. 1B, one 128 kbit memory cell B which is formed symmetrically with respect thereto and one peripheral circuit C, and the arranging process is executed in the exposure apparatus. However, since the exposure files are divided, a slit or an overlap (multiple exposure) may be generated between the files when a resizing process is executed.

The following problems occur when an attempt is made to execute the pattern data processing in the levels of the hierarchical structure according to the conventional method.

When an oversize resizing process is executed on the pattern data which is connected between the levels of the hierarchical structure, an overlap is generated and a multiple exposure occurs at a connection of the levels between the basic memory cells D or between the basic memory cell D and the peripheral circuit C as shown in FIG. 2. On the other hand, when an undersize resizing process is executed on the pattern data, a slit is generated between the levels of the hierarchical structure as shown in FIG. 3.

FIG. 4 shows another example of an overlap generated by an oversize resizing process and a slit generated by an undersize resizing process.

When the overlap exists, the overlap portion swells out, i.e., expands, when a scan is made by a vector scan type electron beam exposure apparatus and the swelled, i.e., expanded, portion may touch an interconnection portion. On the other hand, when the slit exists, a disconnection occurs thereby making it impossible to satisfactorily form an LSI element. That is, the resizing process is executed when executing the pattern data processing, and even when no overlap or slit exists in the design data, the overlap and slit are inevitably generated by an oversize resizing process and an undersize resizing process which are peculiar to the apparatus used to produce the semiconductor integrated circuit device.

In order to eliminate the overlap and the slit, a hierarchical structure developing process must be executed after the resizing process and a process such as the merge process and the slit fill-in process must be executed. However, such processes require an extremely long processing time and an extremely large capacity for storing the developed data.

When an attempt is made to eliminate the overlap by finding the pattern at the connection between two levels, it is necessary to look at the connection between one level and another level in which the present process is executed. But this is an extremely complicated process and impractical. For example, FIG.5 shows an example of the undersize resizing process. In FIG.5, the undersize resizing process can be executed normally at parts P1 and P2 because a portion of the chip A does not connect to a portion of the cell B' at the part P1 and a portion of the cell B' does not connect to a portion of the chip A at the part P2. But the undersize resizing process must be executed so that no slit is generated at a part P3 since a portion of the cell B connects to a portion of the chip A. For the chip A, there is no way of knowing how to treat the pattern at the connection unless all of the memory cells B are arranged and the connecting patterns are found, but this is an extremely complicated and troublesome process. For the memory cell B, the shape of the pattern depends on the location of the memory cell B within the chip A and the pattern at the connection has many possibilities, and it is impossible to manage all the data.

SUMMARY OF THE INVENTION

Accordingly, it is a general object of the present invention to provide a novel and useful pattern data processing method in which the problems described above are eliminated.

Another and more specific object of the present invention is to provide a pattern data processing method for processing hierarchical pattern data which has a hierarchical structure and describes in each level thereof one or a plurality of internal cells constituting one or a plurality of logic blocks of a semiconductor integrated circuit device which is to be produced, which pattern processing method comprises the steps of defining a frame at a boundary between a level i of the hierarchical structure and a level i+1 which is higher than the level i, cutting a first portion of a pattern which protrudes out of the frame from the level i to the level i+1 and setting, (i.e., defining), the cut first portion as a pattern of the level i+1, cutting a second portion of a pattern which protrudes out of the frame from the level i+1 to the level i and casting aside the cut second portion, and repeating the steps of cutting the first and second portions for a predetermined number of levels for increasing values of i, where i=1, 2, ..., n, n is an arbitrary integer and a pattern of the semiconductor integrated circuit device is described in a highest level n+1. According to the pattern data processing method of the present invention, it is possible to execute a resizing process without generating an overlap (multiple exposure) and a slit even when the pattern data is connected at the boundary of the levels. Hence, the processing time and the exposure data quantity can be reduced considerably compared to the conventional method.

Still another object of the present invention is to provide a pattern data processing method for processing a hierarchical pattern data which has a hierarchical structure and describes in each level thereof one or a plurality of internal cells constituting one or a plurality of logic blocks of a semiconductor integrated circuit device which is to be produced, which pattern processing method comprises the steps of defining a frame at a boundary between a level i of the hierarchical structure and a level i+1 which is higher than the level i, and executing a resizing process with respect to patterns which connect at a boundary between two levels so that the patterns remain connected. According to the pattern data processing method of the present invention, it is possible to execute a resizing process without generating an overlap (multiple exposure) and a slit even when the pattern data is connected at the boundary of the levels. Hence, the processing time and the exposure data quantity can be reduced considerably compared to the conventional method.

Other objects and further features of the present invention will be apparent from the following detailed description when read in conjunction with the accompanying drawings.

BRIEF DESCRIPTION OF THE DRAWINGS

FIGS. 2 through 5 respectively are diagrams for explaining an overlap and a slit which are generated by a resizing process;

FIGS. 8A and 8B are diagrams for explaining an empty frame in a second embodiment of the pattern data processing method according to the present invention;

FIGS. 14A through 14D respectively show combinations of line segments;

DESCRIPTION OF THE PREFERRED EMBODIMENTS

Figures 1A, 1B:
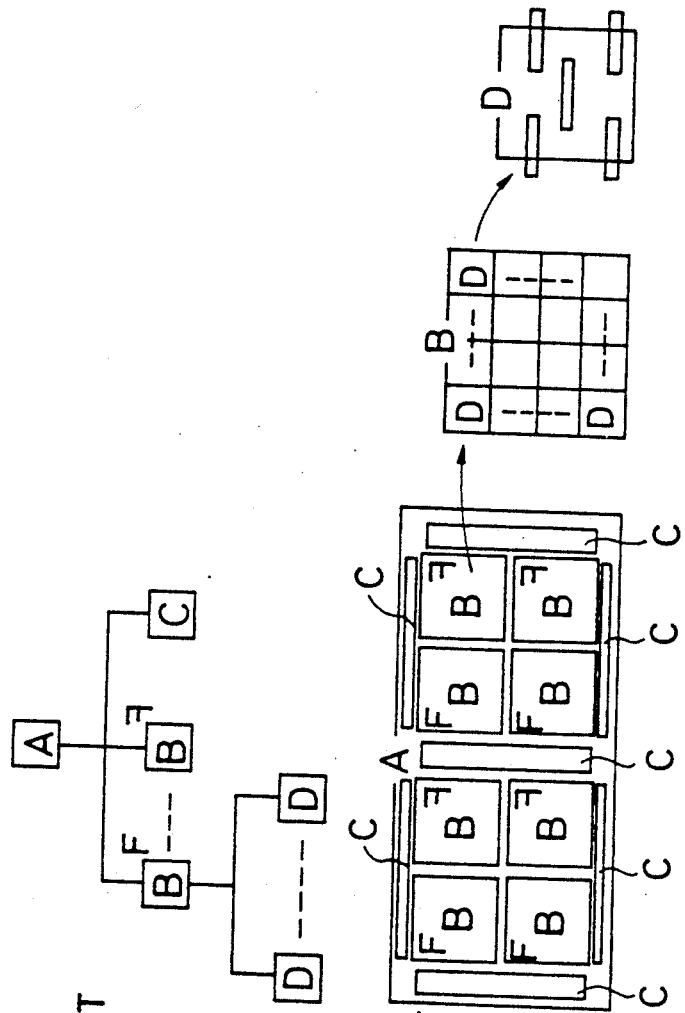
FIG. 1A shows a hierarchical structure of a semiconductor integrated circuit device.
FIG. 1B is a diagram for explaining a layout pattern of the semiconductor integrated circuit device.
Figure 3:
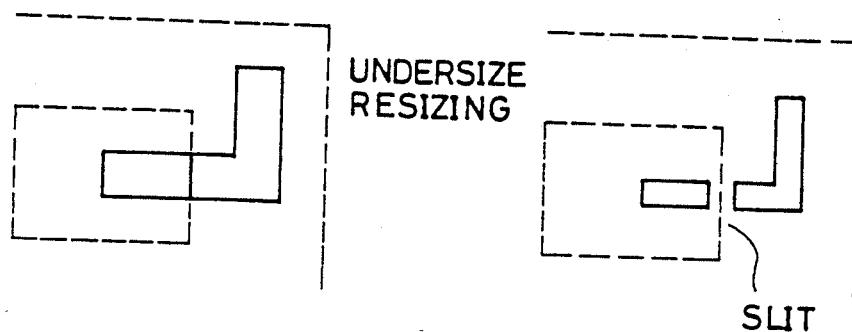
Figure 5:
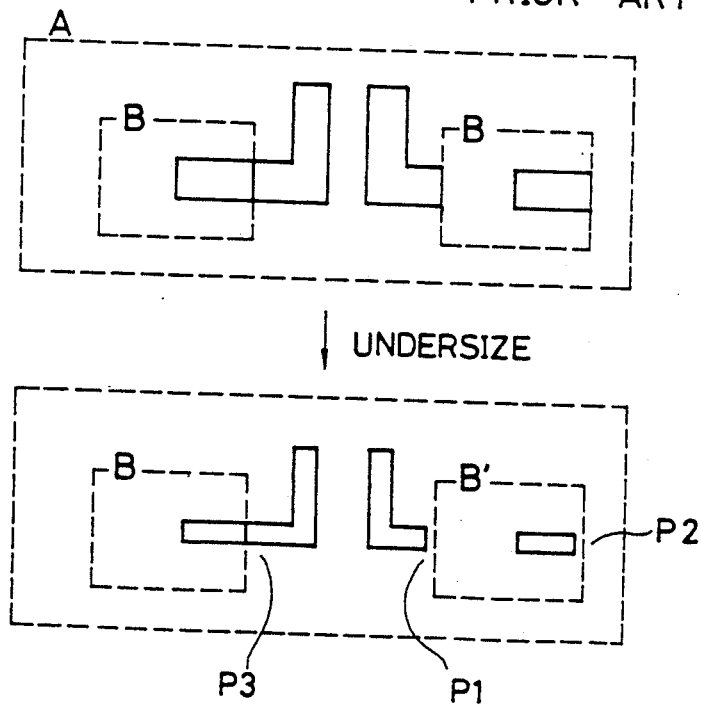
Figure 4:
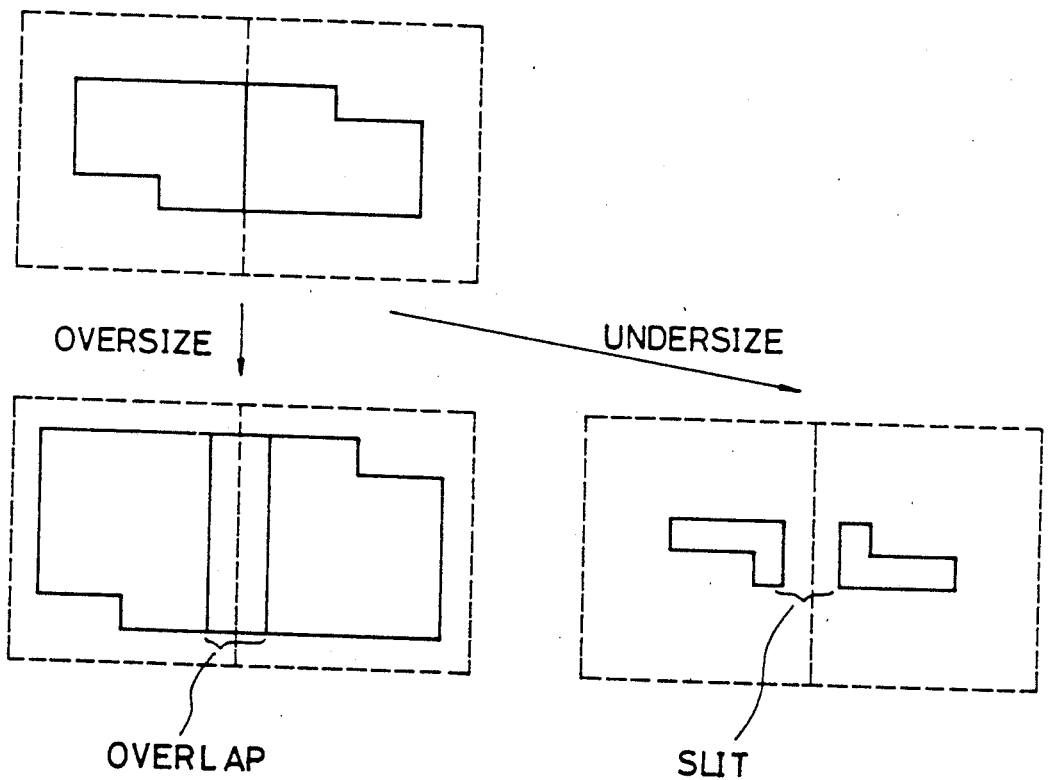
Figure 6B:
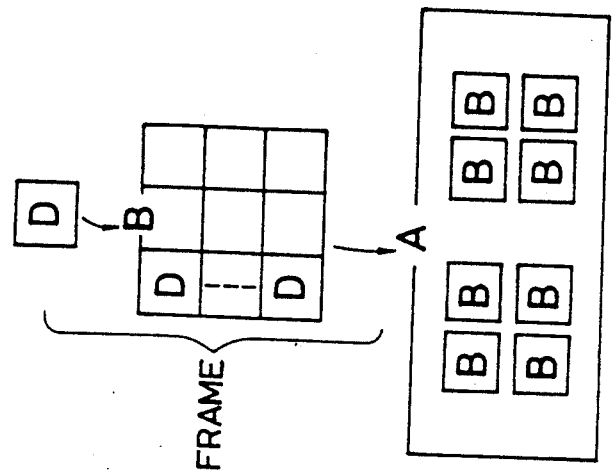
FIGS. 6A and 6B are diagrams respectively for explaining a method of defining a frame in a prior art method and in a first embodiment of a pattern data processing method according to the present invention, for comparison.
Figure 6A:
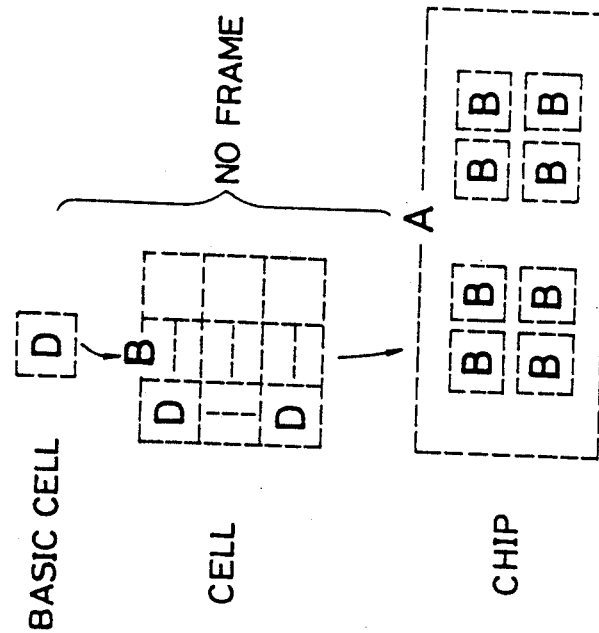

First, a description will be given of a first embodiment of a pattern data processing method according to the present invention, by referring to FIGS. 6A, 6B and 7A through 7D. FIGS. 6A and 6B are diagrams for explaining a method of defining a frame, and FIGS. 7A through 7D are diagrams for explaining a process of registering a pattern which spans two levels of a hierarchical structure.

In FIGS. 6A and 6B, A denotes a chip, B denotes a cell, and D denotes a basic cell. Conventionally, in a layout designing stage, no frame is defined at a boundary between two levels of the hierarchical structure as indicated by a phantom line in FIG. 6A and only the pattern data is entered. However, in a layout designing stage of this embodiment, a frame is defined to indicate a boundary between two levels of the hierarchical structure as indicated by a solid line in FIG. 6B in addition to the pattern data in each level. The layout is determined so that no overlap nor slit is generated in the frame. Each frame corresponds to a general outline of a corresponding one of the chip A, the cell B and the basic cell D.

Next, the process of registering a pattern which spans two levels of the hierarchical structure is executed on a computer in the following procedure. A pattern which spans two frames from a level i to a higher level i+1 is cut along the frame of the level i and the cut portion is regarded as a push-up pattern to the level i+1. A pattern which spans two frames from the level i+1 to the lower level i is cut along the frame of the level i+1 and the protruding portion is cast aside, (i.e., deleted). Such a process is executed for a plurality of levels from the low to high levels. In this embodiment, the process is executed for three levels as described hereunder in conjunction with FIGS. 7A through 7D.

(1) Processing in a low level (group level)

Figure 7A:
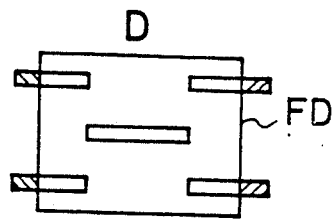
FIGS. 7A through 7D are diagrams for explaining a process of registering a pattern which spans two levels of a hierarchical structure in the first embodiment.

As shown in FIG. 7A, the pattern of the basic cell D is subjected to a logic process to eliminate the overlap and slit. An OR process is executed on the pattern of the basic cell D and an AND process is then carried out between a frame FD of the basic cell D, so as to cut hatched portions of the pattern which protrude out of the frame FD. The thus cut, hatched portions are regarded as a push-up pattern to an intermediate level. These processes are executed by a pattern processing as a series of processes.

(2) Processing in an intermediate level (schedule level)

Figure 7B:
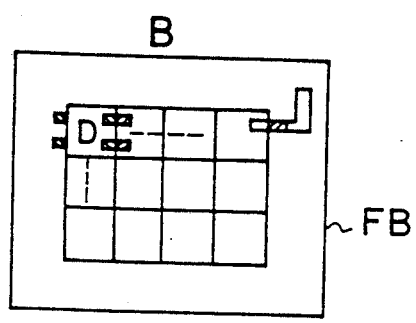
Figure 7C:
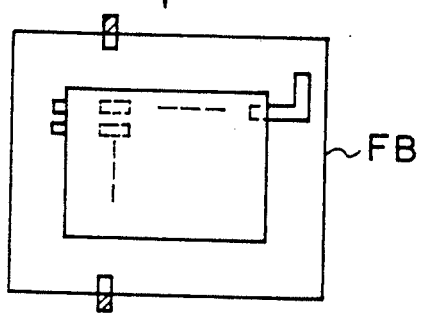

An OR process is carried out between the cut, hatched portions which are obtained by the processing (1) and a pattern of the cell B shown in FIG. 7B which originally exists in the intermediate level, so as to eliminate the overlap. All of the patterns indicated by phantom lines in FIG. 7C which are located within a certain region obtained by carrying out an OR process on the frames FD are deleted from a frame FB of the cell B. These patterns located within the certain region are patterns which span the frames FB and FD from the intermediate level to the low level. In addition, hatched portions which protrude out of the frame FB are cut and the thus cut, hatched portions are regarded as a push-up pattern to a high level.

(3) Processing in a high level (chip level)

Figure 7D:
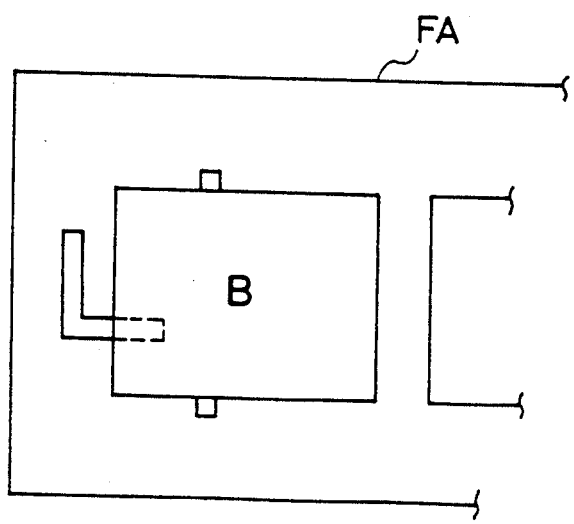

An OR process is carried out between the cut, hatched portions which are obtained by the processing (2) and a pattern of the chip A shown in FIG. 7D which originally exists in the high level, so as to eliminate the overlap. All of the patterns indicated by phantom lines in FIG. 7D which span the frames FA and FB from the high level to the intermediate level are deleted from the frame FA of the chip A.

Normally, the interconnections of the memory cell do not extend inwardly and the connection is always made at the edge of the memory cell. For this reason, no problems will be introduced when a portion which spans two levels from one level i+1 to a lower level i is deleted from the frame of the one level i+1.

After the above described processes, a resizing process is executed in terms of the level of the hierarchical structure. For example, an oversize resizing process is executed so that a pattern does not protrude from a corresponding frame, and an undersize resizing process is executed so that a pattern does not separate from a corresponding frame. Hence, no overlap and no slit is generated.

The overlap of patterns at the connection of two levels is completely eliminated by executing the above described processes. In addition, the cutting and push-up processes in the process of registering the pattern which spans two levels is executed in this embodiment for only three levels and the required processing time is short.

The pattern data was processed for a layout design of a 4 Mbit random access memory (RAM) to observe the effects of this embodiment, where 8-bit basic memory cells are assigned the low level, 32 kbit memory cells are assigned the intermediate level and a chip is assigned the high level of the hierarchical structure. It was found that the overlap (multiple exposure) is completely eliminated. In addition, because the processes are executed in terms of the level of the hierarchical structure, the calculation time was considerably reduced, that is, approximately 1/5 that of the conventional case. Furthermore, because the processes are executed in terms of the level of the hierarchical structure, the exposure data quantity was compressed to 0.01% to 18.55% or less compared to the conventional case. Approximately 90,000,000 patterns conventionally required for the polycrystalline silicon layer in the 4 Mbit RAM was effectively reduced to approximately 1,500,000 patterns according to this embodiment.

Next, a description will be given of a second embodiment of the pattern data processing method according to the present invention. FIGS. 8A and 8B are diagrams for explaining an empty frame, and FIG. 9 is a flow chart for generally explaining this embodiment.

In FIG. 8A, the frame is defined at all boundaries of the levels of the hierarchical structure. When referring to a level i from a higher level i+1, an empty frame indicated by a phantom line in FIG. 8B is defined at the boundary between the levels i and i+1. A resizing process is executed with respect to the empty frame so as not to move an end point o a line segment of a portion which touches the empty frame when a predetermined condition described later is satisfied. Accordingly, in the case of the patterns which connect at the boundary of the levels, no overlap and no slit is generated in the pattern because the end point is not moved by the frame. The hierarchical structure can be maintained because no developing process is required.

Figure 9:
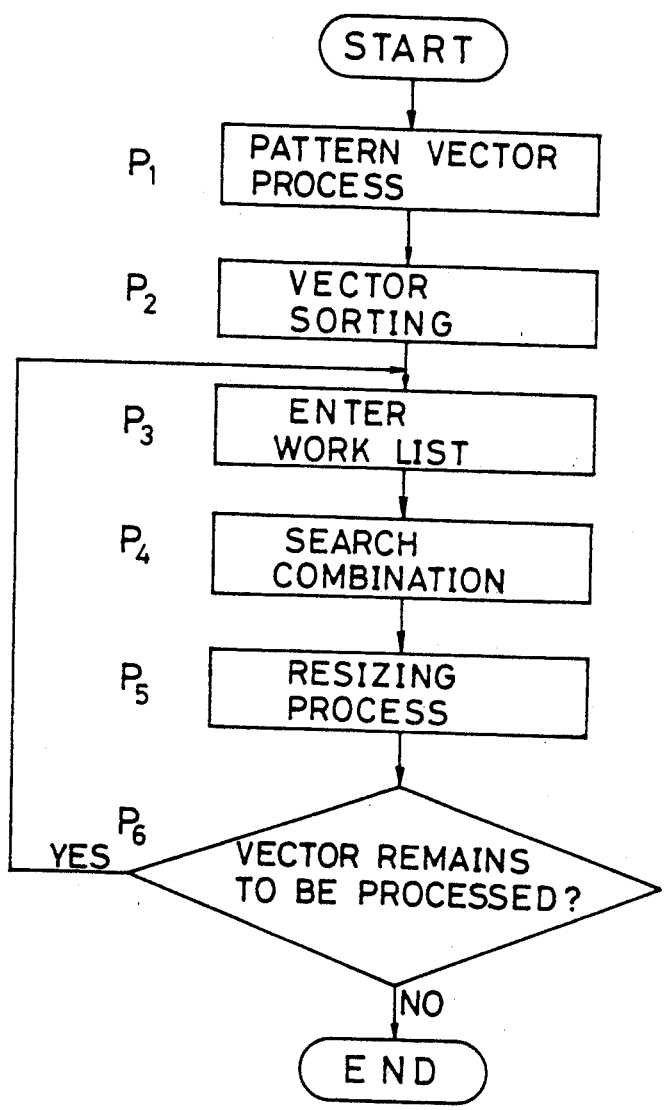
FIG. 9 is a flow chart for generally explaining the second embodiment.

FIG. 9 shows a process of defining the frame. When the process is started, a step P1 divides an input data into line segments which are parallel to an X-axis shown in FIGS. 8A and 8B and slant line segments which are inclined by 45°×n with respect to the X-axis, and carries out a pattern vector process to make line segments each having a line segment direction code and a frame recognition flag and extending to the right in FIGS. 8A and 8B. A step P2 sorts the line segments made by the pattern vector process of the step P1 by taking the X-coordinate of a left end point as the key. A step P3 enters the line segments of identical X-coordinates sorted by the step P2 and consecutively sorts the line segments into an internal storage region. A step P4 consecutively searches the line segments sorted into the internal storage region and finds combinations of the pattern line segments and combinations of the frame line segments. Then, a step P5 discriminates whether or not the line segments found in the step P4 touch the frame and carries out an appropriate resizing process to move the end points if necessary. The step P5 carries out a process including a process of inverting the line segment and a process of making a correction when the line segments at the top and bottom are interchanged. A step P6 discriminates whether or not a vector remains to be processed. The process is ended when the discrimination result in the step P6 is NO, but the process returns to the step P3 when the discrimination result in the step P6 is YES.

Figure 10:
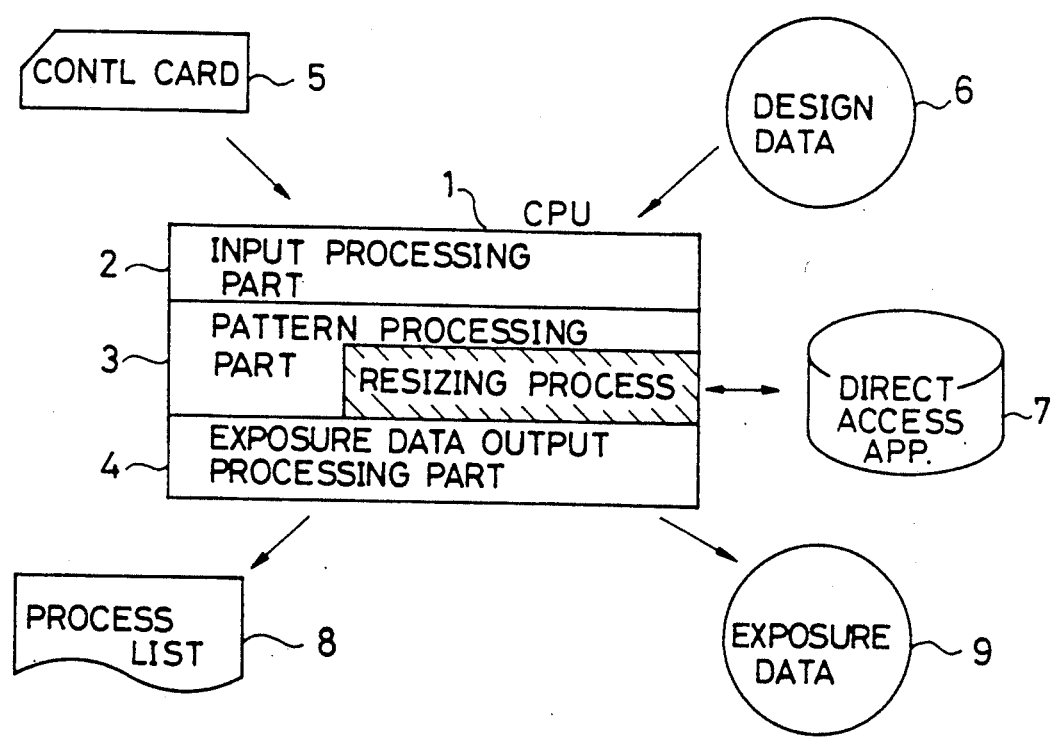
FIG. 10 is a diagram generally showing a system for executing the second embodiment of the pattern data processing method.

In FIG. 10, a central processing unit (CPU) 1 includes an input processing part 2 for inputting and processing pattern data, a pattern processing part 3 for executing a pattern process such as a resizing process, and an exposure data output processing part 4. The second embodiment is employed in the pattern processing part 3. The making of the pattern data and the like is executed by the CPU 1. When a control card 5 for controlling a process of the system is inserted into the input processing part 2, a predetermined pattern processing program is started and design data 6 to be processed is read. A direct access apparatus 7 for work is used to execute a pattern process in the pattern processing part 3, and the course of the process is recorded on a process list 8 and exposure data 9 are output to a magnetic tape or the like.

Figure 11:
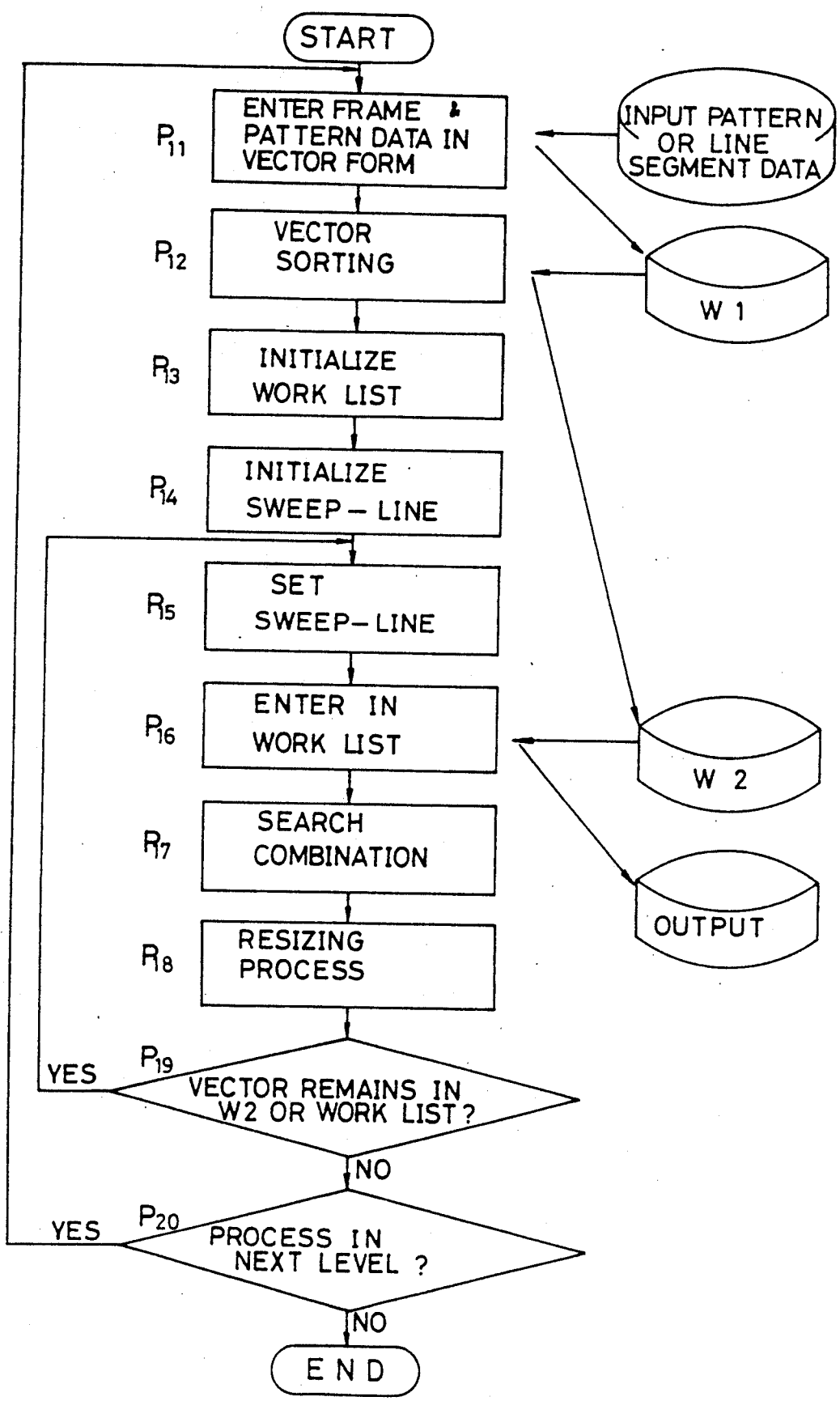
FIG. 11 is a flow chart for explaining an operation of a CPU shown in FIG. 10.

FIG. 11 shows a flow chart of the operation of the CPU 1 shown in FIG. 10. When the pattern process is started, a step P11 enters frame data of the defined frame and pattern data in vector form, and stores line segment data having a format shown in FIG. 12 into a storage W1. In the case shown in FIG. 8B, only the line segments which are indicated by an arrow and generally extend along the X-axis (line segments parallel to the X-axis or oblique thereto) are extracted and stored in the storage W1. Hence, only the line segments parallel to the X-axis and the slant line segments are stored in the storage W1. The line segments extending generally along a Y-axis are similarly entered in vector form. A step P12 sets a main key to a left end point X-coordinate and a sub key to a left end point Y-coordinate and consecutively sorts and stores into a storage W2 the line segment data which are obtained in the step P11. For example, the line segments are sorted from that located at the left, that is, consecutively sorted in an order a1, a2, a3, ... in FIG. 8B.

Figures 12, 13:
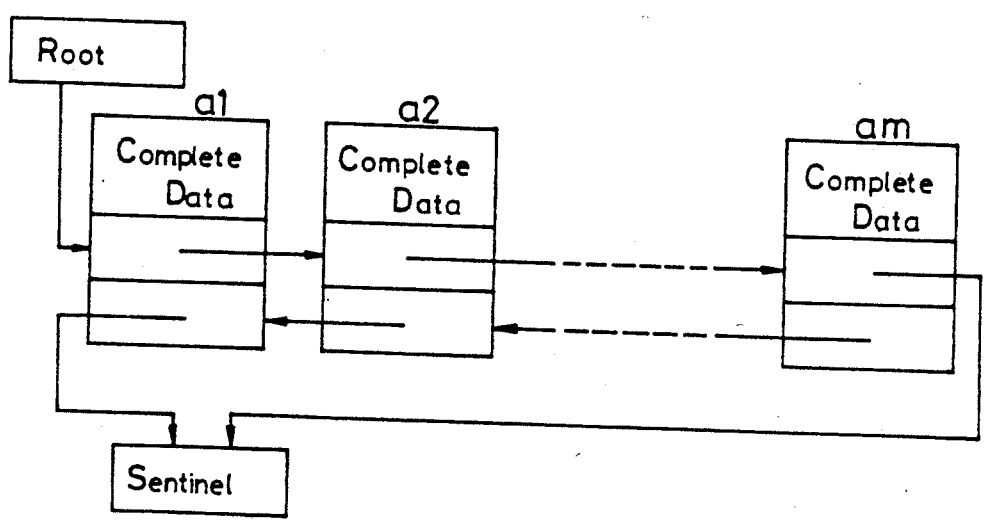
FIG. 12 shows a pattern line segment format.
FIG. 13 shows a structure of a work list.

Next, a step P13 initializes a work list by making a root pointer of the work list shown in FIG. 13 point to a sentinel which indicates an end of the pointer. That is, the spaces of the work list are all assigned a sequence and registered as empty regions with a pointer. Then, a step P14 carries out an initial setting of a sweep-line by setting the smallest X-coordinate in the storage W2 to the sweep-line which is provided with respect to the end point as indicated by a broken line in FIGS. 14A through 14D. A step P15 sets the sweep-line. Between an X-coordinate value which is on the work list and greater than the sweep-line and a left X-coordinate value of a first vector in the storage W2, the step P15 sets the smaller value as the sweep-line value. A step P16 enters the line segment which touches the sweep-line in the work list, and a step P17 finds the combinations of the pattern line segments by successively tracing the line segments within the work list from the bottom. In this case, a frame line segment is stored when found. A step P18 carries out a resizing process with respect to the line segment having one of the combinations shown in FIGS. 14A through 14D by moving the end point if necessary.

Figure 15:
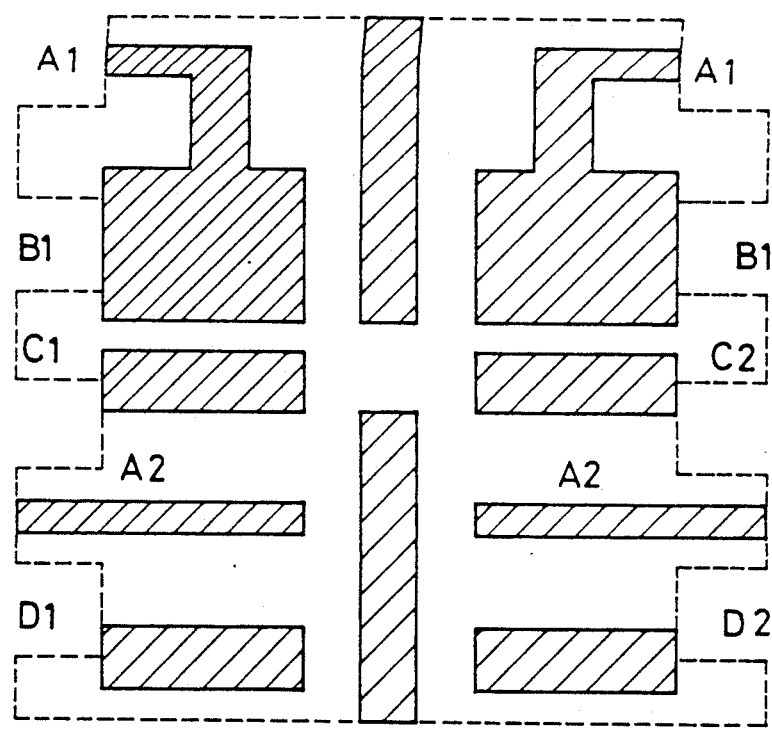
FIG. 15 shows a relationship between a frame and a pattern for the combinations shown in FIGS. 14A through 14D.

Next, a description will be given of the moving of the end point for the resizing process by referring to the line segment combinations shown in FIGS. 14A through 14D. In FIGS. 14A through 14D, the sweep-line is indicated by the broken line, the pattern line segment is indicated by a solid line, the frame line segment is indicated by a bold solid line, and the X-axis corresponds to the horizontal direction. FIG. 15 shows a relationship between a frame and a pattern for the combinations shown in FIGS. 14A through 14D. In FIG. 15, the hatched part indicates the pattern, the solid line indicates the pattern line segment, and the phantom line indicates the frame line segment.

In the case of the line segment combinations shown in FIG. 14A, the sweep-line runs above and below the selected pattern line segment and the frame line segments exist on the left of the sweep-line (case A1) or on the right of the sweep-line (case A2). In this case, the end point X-coordinates of the pattern line segments are not moved.

In the case of the line segment combinations shown in FIG. 14B, the sweep-line runs between the selected pattern line segment and the frame line segments exist on the left of the sweep-line (case B1) or on the right of the sweep-line (case B2). In this case, the end points of the pattern line segments are moved and the pattern line segments are generated. In other words, when making an undersizing, the generation of a line segment having a Y-coordinate identical to the Y-coordinate of the frame line segment on the right of the sweep-line is executed with respect to both the upper and lower frame line segments. On the other hand, when making an oversizing, the generation of a line segment having a Y-coordinate identical to the Y-coordinate of the frame line segment on the left of the sweep-line is executed with respect to both the upper and lower frame line segments.

In the case of the line segment combinations shown in FIG. 14C, the sweep-line runs from the upper pattern line segment to below the lower pattern line segment. One frame line segment is located between the pattern line segments and another frame line segment is located below the lower pattern line segment on the left of the sweep-line (case C1) or on the right of the sweep-line (case C2). In this case, the end points of the pattern line segments are moved and the pattern line segments are generated. In addition, only the Y-coordinate is moved for the lower pattern line segment. That is, when making an undersizing, the generation of a line segment having a Y-coordinate identical to the Y-coordinate of the frame line segment on the right of the sweep-line is executed with respect to the upper frame line segment. On the other hand, when making an oversizing, the generation of a line segment having a Y-coordinate identical to the Y-coordinate of the frame line segment on the left of the sweep-line is executed with respect to the upper and frame line segment.

In the case of the line segment combinations shown in FIG. 14D, the sweep-line runs from the lower pattern line segment to above the upper pattern line segment. One frame line segment is located between the pattern line segments and another frame line segment is located above the upper pattern line segment on the left of the sweep-line (case D1) or on the right of the sweep-line (case D2). In this case, the end points of the pattern line segments are moved and the pattern line segments are generated. That is, when making an undersizing, the generation of a line segment having a Y-coordinate identical to the Y-coordinate of the frame line segment on the right of the sweep-line is executed with respect to the lower frame line segment. On the other hand, when making an oversizing, the generation of a line segment having a Y-coordinate identical to the Y-coordinate of the frame line segment on the left of the sweep-line is executed with respect to the lower and frame line segment.

The end points of both the upper and lower pattern line segments are moved for line segment combinations other than those shown in FIGS. 14A through 14D.

Returning now to the description of FIG. 11, a step P19 discriminates whether or not a vector remains in the storage W2 or the work list. The process returns to the step P15 when the discrimination result in the step P19 is YES. In this case, the steps P15 through P18 are repeated until no more line segment data remains within the storage W2 and the work list. On the other hand, when the discrimination result in the step P19 is NO, it is discriminated that the process is ended for the concerned level and a step P20 discriminates whether or not a process is to be executed for a next level. When there remains a level for which the process is to be executed, the discrimination result in the step P20 is YES and the process returns to the step P11. However, the process is ended when the discrimination result in the step P20 is NO.

According to this embodiment, it is possible to execute the resizing process without generating the overlap and slit in the pattern data which connect between the levels even when the pattern data have the hierarchical structure. Conventionally, the resizing process is abandoned when the overlap and slit are generated a a flat processing is executed instead so as to eliminate the overlap and fill in the slits, but this embodiment can eliminate the inconveniences of the flat processing. Because the process can be executed in terms of the level of the hierarchical structure, the time required to process the pattern data is greatly reduced.

Figure 16:
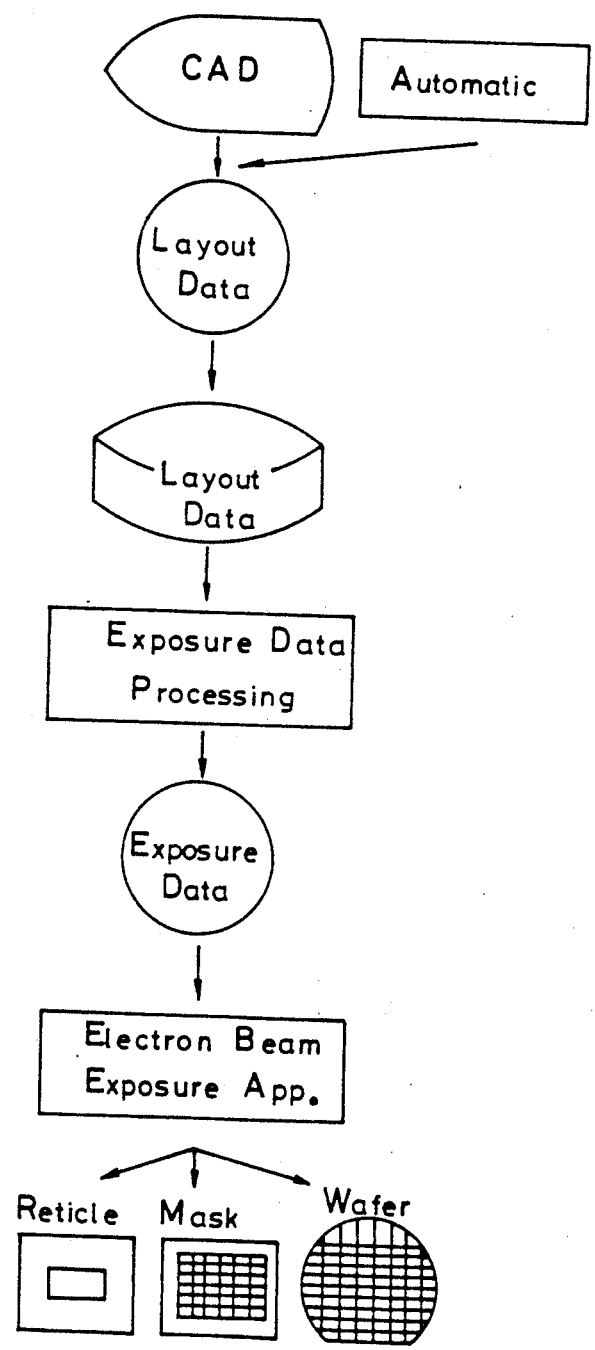
FIG. 16 is a diagram for explaining a relationship between the first and second embodiments.

FIG. 16 is a diagram for explaining a relationship between the first and second embodiments, and shows the production sequence of a semiconductor integrated circuit device. First, the design data related to circuit patterns are input by a computer aided design (CAD) apparatus together with frame data on the frames. The layout of a gate array or the like is automatically performed by a computer. The layout data is recorded on a magnetic tape, for example, and this layout data is then stored in a storage, or memory. The layout data stored in the storage is subjected to the exposure data processing which includes the merge process for eliminating the overlap and the undersize/oversize resizing process. The resizing process is executed to correct a distortion at the time of the exposure, to make a design rule modification, and/or to eliminate a notch. The design rule modification enables a modification of an interconnection width, transistor characteristic and the like. The exposure data obtained by the exposure data processing is recorded on a magnetic tape and is then supplied to an electron beam exposure apparatus which scans a reticle, a mask, or a wafer. In the electron beam exposure apparatus, an electron beam scans the wafer via the mask or scans the wafer directly. The mask is made by use of the reticle or by a direct exposure.

Further, the present invention is not limited to these embodiments, but various variations and modifications may be made without departing from the scope of the present invention.

What is claimed is:

1. A pattern data processing method for processing hierarchical pattern data which as a hierarchical structure and describes in each level thereof one or a plurality of internal cells constituting one or a plurality of logic blocks of a semiconductor integrated circuit device which is to be produced, said pattern processing method comprising the steps of:
   defining a frame at a boundary between a level i of the hierarchical structure and a level i+1 which is higher than the level i;
   cutting a first portion of a pattern which protrudes out of the frame from the level i to the level i+1 and defining the cut first portion as a pattern of the level i+1, said pattern being made up of line segments;
   cutting a second portion of a pattern which protrudes out of the frame from the level i+1 to the level i and deleting the cut second portion; and
   repeating said steps of cutting the first and second portions for a predetermined number of levels for increasing values of i, where i=1, 2, ..., n, n is an arbitrary integer and the pattern of the semiconductor integrated circuit device is described in a highest level n+1.

2. The pattern data processing method as claimed in claim 1 wherein said step of defining the frame defines a frame which corresponds to a general outline of one of the internal cells, the logic blocks and the semiconductor integrated circuit device depending on the boundary.

3. The pattern data processing method as claimed in claim 1 wherein n+2, a pattern in the level 1 corresponding to a basic cell, a pattern in the level 2 corresponding to a plurality of certain cells respectively made up of a plurality of the basic cells, a pattern in the level 3 corresponding to the semiconductor integrated circuit device made up of one or a plurality of the certain cells.

4. The pattern data processing method as claimed in claim 1 wherein said predetermined number of levels is equal to n+1.

5. The pattern data processing method as claimed in claim 1 which further comprises the step of executing a resizing process with respect to patterns which connect at a boundary between two levels so that the patterns remain connected.

6. The pattern data processing method as claimed in claim 5 wherein said resizing process is selected to one of an oversize process and an undersize process.

7. The pattern data processing method as claimed in claim 5 wherein said step of executing the resizing process keeps fixed a coordinate of an end point of each line segment of the patterns in the level i+1 which connect to the frame of the level i when a predetermined condition is satisfied.

8. The pattern data processing method as claimed in claim 7 wherein said predetermined condition includes a condition that parallel upper and lower frame line segments are respectively located above and below parallel upper and lower pattern line segments one one side of a sweep-line which connects end points of the upper and lower pattern line segments and extends above and below the upper and lower pattern line segments, said coordinate being taken along a direction in which the upper and lower pattern line segments and the upper and lower pattern line segments extend.

9. A pattern data processing method for processing hierarchical pattern data which has a hierarchical structure and describes in each level thereof one or a plurality of internal cells constituting one or a plurality of logic blocks of a semiconductor integrated circuit device which is to be produced, said pattern processing method comprising the steps of:
   defining a frame at a boundary between a level i of the hierarchical structure and a level i+1 which is higher than the level i; and
   executing a resizing process with respect to patterns which connect at a boundary between two levels so that the patterns remain connected, said patterns respectively being made up of line segments and said resizing process being executed so that a pattern does not protrude from a corresponding frame when the resizing process is an oversize resizing process and so that a pattern does not separate from a corresponding frame when the resizing process is an undersize resizing process.

10. The pattern data processing method as claimed in claim 9 wherein said step of executing the resizing process keeps fixed a coordinate of an end point of each line segment of the patterns in the level i+1 which connect to the frame of the level i when a predetermined condition is satisfied.

11. The pattern data processing method as claimed in claim 10 wherein said predetermined condition includes a condition that parallel upper and lower frame line segments are respectively located above and below parallel upper and lower pattern line segments on one side of a sweep-line which connects end points of the upper and lower frame line segments and extends above and below the upper and lower pattern line segments, said coordinate being defined along a common direction in which the upper and lower pattern line segments and the upper and lower pattern line segments extend.

12. A pattern data processing method for processing a hierarchical pattern data which has a hierarchical structure and describes in each level thereof one or a plurality of internal cells constituting one or a plurality of logic blocks of a semiconductor integrated circuit device which is to be produced, said pattern processing method comprising the steps of:

defining a frame at a boundary between a level i of the hierarchical structure and a level i+1 which is higher than the level i; and executing a resizing process with respect to patterns which connect at a boundary between two levels so that the patterns remain connected, said step of defining the frame defining a frame which corresponds to a general outline of one of the internal cells, the logic blocks and the semiconductor integrated circuit device, depending upon the boundary.

13. The pattern data processing method as claimed in claim 12 wherein said resizing process is selected to be one of an oversize process and an undersize process.

14. A pattern data processing method for processing hierarchical pattern data which has a hierarchical structure and describes in each level thereof one or a plurality of internal cells constituting one or a plurality of logic blocks of a semiconductor integrated circuit device which is to be produced, said pattern processing method comprising the steps of:

defining a frame at a boundary between a level i of the hierarchical structure and a level i+1 which is higher than the level i; and executing a resizing process with respect to patterns which connect at a boundary between two levels so that the patterns remain connected, the number of levels of the hierarchical structure being three, a pattern in a first level corresponding to a basic cell, a pattern in a second level corresponding to a plurality of certain cells respectively made up of a plurality of the basic cells, and a pattern in a third level corresponding to the semiconductor integrated circuit device made up of one or a plurality of the certain cells.

15. The pattern data processing method as claimed in claim 14 wherein said resizing process is selected to be one of an oversize process and an undersize process.

* * * * *

UNITED STATES PATENT AND TRADEMARK OFFICE
CERTIFICATE OF CORRECTION

PATENT NO. : 5,046,012
DATED : September 3, 1991
INVENTOR(S) : Kazumasa MORISHITA et al.

It is certified that error appears in the above-identified patent and that said Letters Patent is hereby corrected as shown below:

On the title page, Item [73]: change "Vlsi" to --VLSI--;

[57] ABSTRACT:

line 11, change "form" to --from--.

Col. 1, line 16, change "the" (second occurrence) to --be--.

Col. 3, line 21, after "setting" delete ",";
line 24, after "aside" insert --(i.e., deleting)--.

Col. 6, line 22, change "o" to --of--.

Col. 9, line 15, change "a a" to --and a--;
line 54, change "as" to --has--.

Col. 10, line 17, change "n + 2" to --n = 2--;
line 45, change "one one" to --on one--.

Signed and Sealed this

Twenty-first Day of September, 1993

Attest:

BRUCE LEHMAN

Attesting Officer     Commissioner of Patents and Trademarks